United States Patent
Shahpar

(10) Patent No.: US 10,297,080 B2
(45) Date of Patent: May 21, 2019

(54) OPTIMIZATION OF AN AUTOMATICALLY MESHABLE SHAPES

(71) Applicant: ROLLS-ROYCE plc, London (GB)

(72) Inventor: Shahrokh Shahpar, Derby (GB)

(73) Assignee: ROLLS-ROYCE plc, London (GB)

( * ) Notice: Subject to any disclaimer, the term of this patent is extended or adjusted under 35 U.S.C. 154(b) by 0 days.

(21) Appl. No.: 15/787,199

(22) Filed: Oct. 18, 2017

(65) Prior Publication Data

US 2018/0108177 A1 Apr. 19, 2018

(30) Foreign Application Priority Data

Oct. 19, 2016 (GB) .................................. 1617666.1

(51) Int. Cl.
| | | |
|---|---|---|
| *G06F 17/11* | (2006.01) | |
| *G06T 17/30* | (2006.01) | |
| *G06F 17/50* | (2006.01) | |
| *G06T 17/20* | (2006.01) | |

(52) U.S. Cl.
CPC .......... *G06T 17/30* (2013.01); *G06F 17/5018* (2013.01); *G06F 17/5095* (2013.01); *G06T 17/205* (2013.01)

(58) Field of Classification Search
None
See application file for complete search history.

(56) References Cited

U.S. PATENT DOCUMENTS

| | | | |
|---|---|---|---|
| 5,883,631 A | 3/1999 | Konno et al. | |
| 9,323,869 B1* | 4/2016 | Kanthasamy | ....... G06F 17/5018 |
| 9,600,624 B2* | 3/2017 | Jain | ...................... G06F 17/5095 |
| 10,002,209 B2* | 6/2018 | Cellier | ....................... F01D 5/14 |
| 2002/0085004 A1 | 7/2002 | Lim et al. | |
| 2006/0187219 A1* | 8/2006 | Olhofer | .................... G06T 17/30 345/418 |
| 2007/0226661 A1* | 9/2007 | Olhofer | ................... G06T 17/30 703/1 |
| 2010/0053170 A1* | 3/2010 | Esquej Alonso | ... G06F 17/5018 345/441 |

OTHER PUBLICATIONS

Great Britain Search Report dated Mar. 20, 2017, issued in GB Patent Application No. 1617666.1.

* cited by examiner

*Primary Examiner* — Martin Mushambo
(74) *Attorney, Agent, or Firm* — Oliff PLC

(57) ABSTRACT

A computer-implemented method of optimizing an automatically meshable shape is provided. The method includes the steps of: providing a continuous boundary of the automatically meshable shape, the continuous boundary being defined by a spline formed by two or more spline segments, wherein each segment has a terminal point at each end of the segment; parameterizing shape properties of the segments such that selected ones of the shape properties can be varied under operation of an optimization algorithm; linking each segment to its immediately adjacent segments such that the terminal points of the segment remain coincident with the terminal points of its immediately adjacent segments under operation of the optimization algorithm; and using the optimization algorithm to vary selected ones of the shape properties of the segments, whereby the spline defines an adjusted boundary that remains continuous so that the shape remains automatically meshable.

11 Claims, 5 Drawing Sheets

```
5
Seg1
0 0.0225 -90 1.01 20
0.29157 0.28488 -90
0.0 0.0 90
Seg2
1 0.0 0.0 1.01 99
0.0 0.0 -49.4
0.35095 0.22079
0.39786 0.225 196.26
Seg3
0 0.024134 102.87 1.01 99
0 0 102.87
0 0 -77.13
Seg4
0 0.00593 45.0 2.0 0
0.0 0.0 45.0
0.0 0.0 135.0
Seg5
2 0.0 0.0 1.01 0
0.0 0.0 -45.0
0.4221 0.23465
0.45428 0.23984
0.4935 0.23984 180
```

OPTIMIZATION OF AN AUTOMATICALLY MESHABLE SHAPES

CROSS-REFERENCE TO RELATED APPLICATIONS

This application is based upon and claims the benefit of priority from British Patent Application Number 1617666.1 filed 19 Oct. 2016, the entire contents of which are incorporated by reference.

BACKGROUND

The present invention relates to optimization of an automatically meshable shapes.

CFD simulation can be used for modelling the flow of a fluid through a space, e.g. a volume. For example, CFD is often used to model the flow of air through a component of an aerospace engine. In order to use CFD, a model of the component of the aerospace engine has to be created.

Such models are usually created by a user, generally by using one or more splines (a curve constructed so as to pass through a number of given points). The spline defines a boundary of the component (e.g. a wall) through which the fluid being simulated cannot pass. This boundary is used to mesh the bounded space which it defines, such that the CFD simulator can use the resulting mesh to simulate the fluid flow through the shape. Meshing involves partitioning the defined space into a number of segments or subdomains in and over which differential equations can be solved in a computationally efficient manner. It is important when meshing that there are no overlaps or gaps in the boundary i.e. so that in mathematical terms the boundary is a manifold. This allows the bounded space to be automatically meshed by computer-based meshing software. Discontinuities in the gradient and/or the curvature of the boundary are, however, allowed.

The space being modelled will often be optimized, and hence altered in shape, with respect to a given parameter of the fluid flow. Conventionally, a new spline must then be defined by the user as a result of the shape alteration. Conventionally this is a time-consuming manual process, and may lead to overlaps or gaps in the boundary such that the space becomes unmeshable.

BRIEF SUMMARY OF THE DISCLOSURE

Accordingly, in a first aspect, the invention provides a computer-implemented method of optimizing an automatically meshable shape, the method including the steps of:

- providing a continuous boundary of the automatically meshable shape, the continuous boundary being defined by a spline formed by two or more spline segments, wherein each segment has a terminal point at each end of the segment;
- parameterising shape properties of the segments such that selected ones of the shape properties can be varied under operation of an optimization algorithm;
- linking each segment to its immediately adjacent segments such that the terminal points of the segment remain coincident with the terminal points of its immediately adjacent segments under operation of the optimization algorithm; and
- using the optimization algorithm to vary selected ones of the shape properties of the segments, whereby the spline defines an adjusted boundary that remains continuous so that the shape remains automatically meshable.

As a result of linking each segment to its immediately adjacent segments, the variation in the properties of the segments can be performed automatically in response to the optimization algorithm. Therefore the speed at which an optimum solution can be found may be increased.

Further aspects of the present invention provide: a computer program comprising code which, when run on a computer, causes the computer to perform the method of the first aspect; a computer readable medium storing a computer program comprising code which, when run on a computer, causes the computer to perform the method of the first aspect; and a computer system programmed to perform the method of the first aspect. For example, a computer system can be provided for optimizing an automatically meshable shape, the system including: one or more processors configured to: provide a continuous boundary of the automatically meshable shape, the continuous boundary being defined by a spline formed by two or more spline segments, wherein each segment has a terminal point at each end of the segment; parameterise shape properties of the segments such that selected ones of the shape properties can be varied under operation of an optimization algorithm; link each segment to its immediately adjacent segments such that the terminal points of the segment remain coincident with the terminal points of its immediately adjacent segments under operation of the optimization algorithm; and use the optimization algorithm to vary selected ones of the shape properties of the segments, whereby the spline defines an adjusted boundary that remains continuous so that the shape remains automatically meshable. The system thus corresponds to the method of the first aspect. The system may further include: a computer-readable medium or media operatively connected to the processors, the medium or media storing the spline. The system may further include: a display device for displaying the boundary of the automatically meshable shape.

An additional aspect of the invention provides a process for forming a gas turbine engine component, the process including: performing the method of the first aspect and manufacturing the component having the optimized automatically meshable shape.

Optional features of the invention will now be set out. These are applicable singly or in any combination with any aspect of the invention.

The linking step may also include defining a gradient at a terminal point of at least one of the segments to be equal to a gradient at the coincident terminal point of an immediately adjacent segment under operation of the optimization algorithm.

The number of segments forming the spline may be defined as an integer N, and the method may conveniently include varying N in response to the parameterisation of the segments and/or under operation of the optimization algorithm.

The shape properties of each segment may include any one or more of: a coordinate position of a terminal point of the segment; a gradient of the segment at a terminal point of the segment; a distance between the terminal points of the segment; and an angle between a reference line and a line connecting the terminal points of the segment.

The spline may be a cubic BSpline.

The optimization algorithm may be a genetic algorithm or a design-of-experiment algorithm.

The optimization algorithm may implement a computational fluid dynamics simulation of the automatically meshable shape. However, the optimization algorithm may implement a finite element simulation, finite difference method, or other similar simulations involving discretisation of the automatically meshable shape.

The automatically meshable shape may be the shape of a gas turbine engine component. For example, the component may be combustion equipment of a gas turbine engine.

BRIEF DESCRIPTION OF THE DRAWINGS

Embodiments of the invention will now be described by way of example with reference to the accompanying drawings in which.

DETAILED DESCRIPTION

Figures 1, 2:
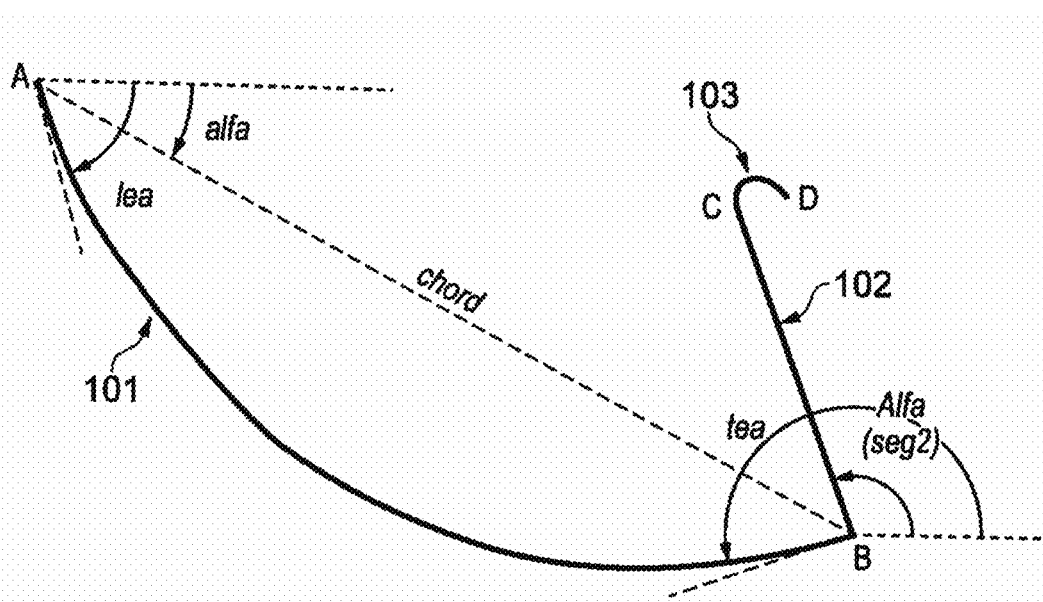
FIG. 1 shows a diagram of a curve defined by a spline.
FIG. 2 shows a table for defining a spline.

As explained below, a spline defines a continuous curve which passes through a number of points. The curve shown in FIG. 1 is formed of three spline segments. The first segment 101 passes from point A to point B, the second from point B to point C, and the third from point C to point D. Each segment is defined by the point from which it starts—point A—and the point at which it ends—point B, as well as an angle (lea) between the horizontal and the gradient of the segment at the segment start point, and an angle (tea) between the horizontal and the gradient of the segment at the segment end point. The end point B can be defined by its distance from the start point (chord) and its angle from the horizontal (alfa). As explained in more detailed below, spline control points are distributed automatically such that the resultant smooth curve achieves these angles and length specifications.

The second segment 102 starts at point B and ends at point C. In contrast to the first segment, the second segment is not curved, but instead it is a straight line between points B and C. Its alfa describes the angle between point B and point C from the horizontal (e.g. the engine axis in a gas-turbine engine). The angles may be taken in an anti-clockwise direction from the horizontal as shown. The third 103 (and final) segment starts at point C and ends at point D. As with the first segment it is curved but has a reduced length defined by the segment's chord parameter.

FIG. 2 shows a table capable of defining a spline. The first line '5' defines the number i of segments that the spline comprises. The subsequent line, 'Seg1' and similarly labelled lines e.g. Seg2, Seg3, etc. define the title of the respective segment for ease of use. These titles are headings to demark one segment from another, such that all of the parameters defined after Seg1 and before Seg2 (for example) all relate to the segment referred to as Seg1.

Within a segment heading, the first line defines the following variables: nsp chord alfa beta np. Where nsp is the number of additional interior control points i.e. the number of additional spline poles usable modify the segment in response to an optimizing algorithm; chord is the length of a straight line from the start to end points which define the segment; alfa defines the angle from the start point to the end point relative to the horizontal (engine) axis; beta defines the clustering used for the final CFD mesh distribution; and np defines the number of nodal points used for this segment which is related to the number of subdomains the segment will produce when meshed.

The use of chord and alfa is optional, and if no value is set for chord then the coordinate values of the end point are read from the last input line given for this segment. An example of this is shown in Seg2 and Seg5 of the table in FIG. 2. If np is set to zero, a number of nodal points greater than zero will be computed based on the relative size of the segment relative to a reference segment (e.g. the first segment). Where the first segment acts as the reference segment, the value for np cannot be set as zero for this first segment. For example, as shown in FIG. 2, for Seg1 the np value is 20. Therefore, if the clustering factor beta is constant, and the mesh points are computed based on their relative segment length, the corner mesh sizes will be consistent at each junction of the segments. It should be noted that beta needs to be larger than 1.0 (i.e. not equal to it), and that a value closer to 1.0 indicates an increase in clustering. For example, 1.001 results in a much greater clustering as compared with 1.01 or 1.1. Larger values such as 2 or 3 produce an almost uniform mesh spacing.

The second line within a segment heading defines the values of the x coordinate position, the y coordinate position, and the angle lea at the start point.

If the x and y coordinate positions are given as zero in the second line, then the start point for the segment is made coincident with the end point of the previous segment. By linking adjacent segments in this way, when a segment is adjusted by an optimization algorithm, overlaps and gaps in the spline can be prevented.

The last line within a segment heading defines the x coordinate position, the y coordinate position and the angle tea for the end point of the segment. If chord is non-zero, however, these x and y coordinate positions are ignored.

If nsp is greater than zero, then between the second line and the last line within a segment heading are further lines, each giving the x coordinate position and the y coordinate position for a respective one of the additional interior control points. Values of the x and y coordinates of the interior control points may be calculated based on the specified end gradients i.e. lea and tea, and a length, which may be taken as a proportion, e.g. a quarter, of the distance between the respective end point and the adjacent control point (be it an interior control point or end point) of the segment. Thus as more interior control points are defined, the curve tangency becomes more localised. Generally, specifying two end points and two angles is a compact way of defining (and controlling) a segment during optimization.

This format is repeatable to define as many segments as needed to represent an object as a spline.

Figure 3:
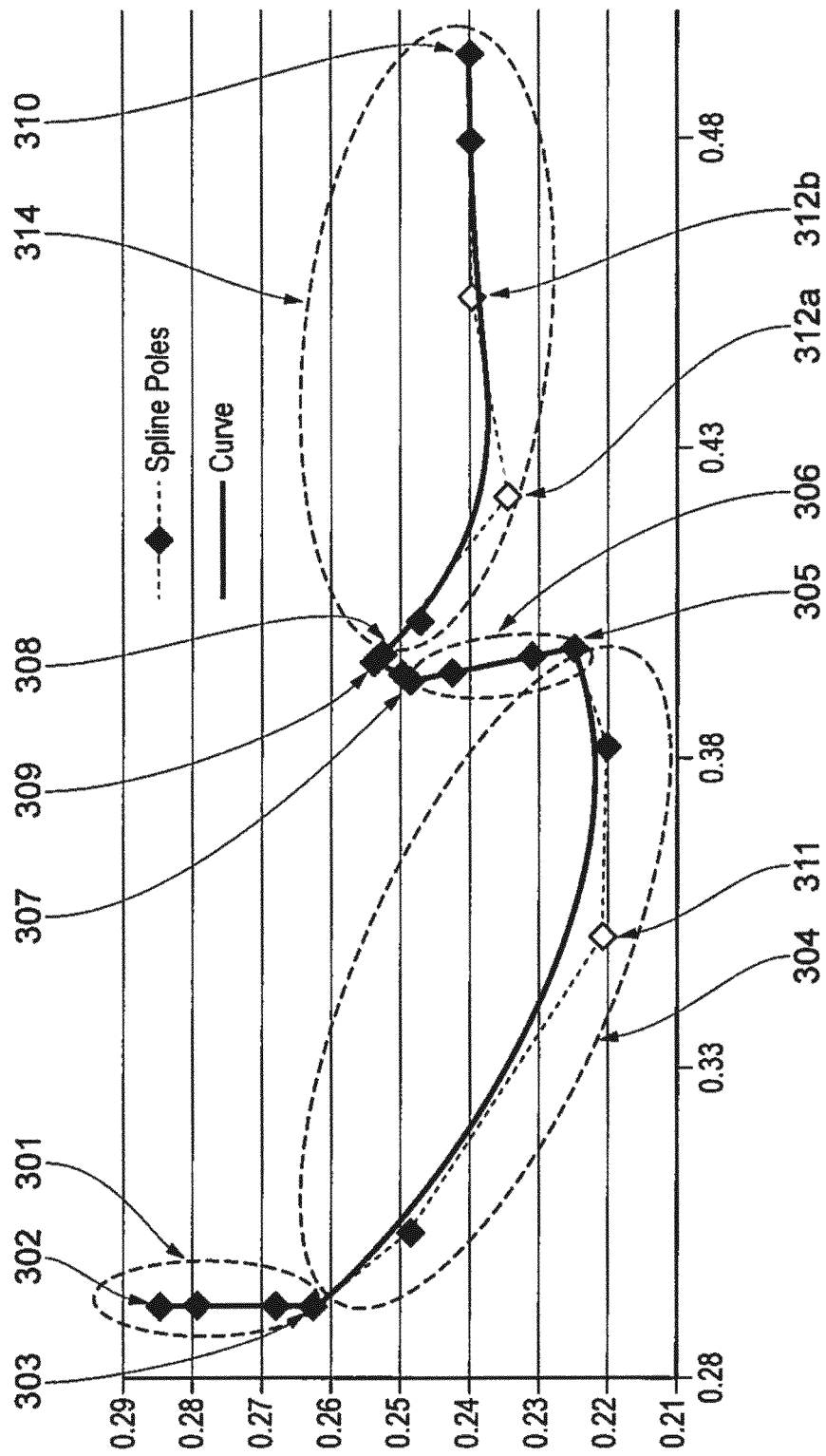
FIG. 3 shows the spline defined by the table of FIG. 2.

The table shown in FIG. 2 defines a spline shown in FIG. 3. The spline includes five defined segments 301, 304, 306, 309, 314. The first segment starts at point 302 and, as defined by line one of the Seg1 portion of the table, projects at an angle of −90° from the horizontal starting from a chord length of 0.0225. The start point, as defined by line two of the Seg1 portion of the table, has coordinates [0.29157, 0.28488]. The coordinates of the end point 303 are undefined by line three of the table, as they are determined from the start point coordinates, the chord length and the chord angle. In this example, the end point is determined to have coordinates [0.29157, 0.26238].

Moving to the second segment 304, this segment starts from point 303 which is the end point of the previous segment 301, and thus the x and y coordinates in line two of the Seg2 portion of the table are given the values [0, 0].

The second segment 304 is defined with an additional interior control point 311 by defining nsp as being equal to one, line three of the Seg2 portion of the table specifying that the control point should have coordinates [0.35095, 0.22079]. The Seg2 portion of the table then defines an absolute position for the end coordinate 305 on line four as [0.39786, 0.225], with a gradient angle (tea) at the end point of 196.26° from the horizontal.

Defining the additional interior control point 311 increases the adjustability of the second segment 304 by an optimization algorithm.

The third segment 306 is defined under the Seg3 heading in the table. In this case nsp is set to zero. The start point 305 is again defined as being equal to the end point of the previous segment by defining its coordinates in the table as having a value [0, 0]. The end point 307 of the third segment is not defined with an absolute position. Instead, as with the first segment, the end point's coordinates are determined from chord and alfa values. The trajectory of the line between the start and end points is then further defined by the lea and tea value.

The fourth segment 309 is defined under the Seg4 heading of the table in a similar way to the third segment 306. However, its clustering factor beta of 2.0 is different relative to the other segments.

The fifth and final segment 314 is defined under the Seg5 heading of the table. Its start point is also defined to be coincident with the end point of the immediately preceding segment. Moreover, by setting its start point angle lea to be −45° while the end point angle tea of the fourth segment is set at 135° imposes equal gradients on the start and end points. The end point of the fifth segment is given an absolute value as indicated by the last line of the Seg5 section: [0.4935, 0.23984]. The fifth segment also has two additional interior control points 312a, 312b as indicated by setting nsp equal to two on the first line. The third and fourth lines under the Seg5 heading define the absolute positions of these control points.

Figure 4:
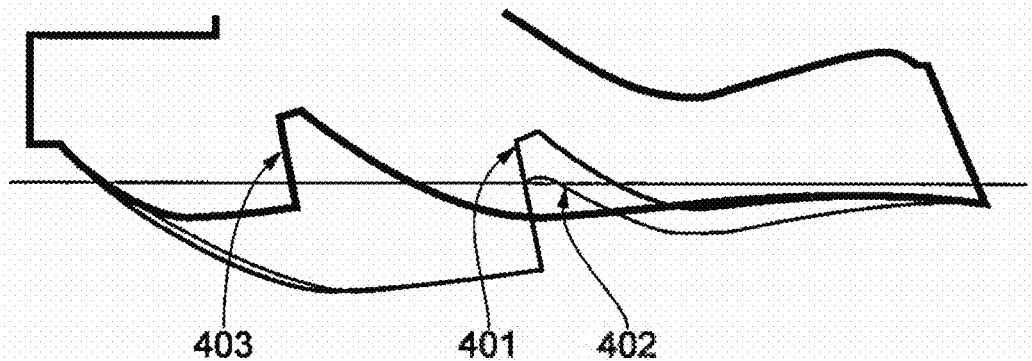
FIG. 4 shows a diagram of the curve produced by the spline of FIG. 3 as it is varied by the optimizer.

The spline as defined by the table shown in FIG. 2, and illustrated in FIG. 3, can then be efficiently operated upon by an optimization algorithm to form a valid (meshable) manifold. As shown in FIG. 4, an initial spline producing an initial boundary shape 401 is analysed, for example using computational fluid dynamics, and based on the results of the analysis the spline is varied. The type of variation can be controlled by specifying which parameterising shape properties (i.e. which segment terminal point positions, interior control point positions, and gradient angles) can be altered by the algorithm. For example, allowing the optimization algorithm to modify the positions of the interior control points in segments 2 and 5, and the end point of segment 3 produces a varied spline defining a varied boundary shape 402 in which the raised portion defined by segments 3, 4, and 5 is lowered relative to the initial spline 401. However, as can be seen, the varied boundary shape 402 advantageously maintains the general profile of the initial boundary shape 401 and remains a continuous curve with no overlaps or gaps due to the linking together of end points and start points of adjacent segments. Therefore, the varied boundary shape 402 which is the result of an initial analysis by the optimization algorithm can itself be subject to further analysis by the optimization algorithm.

This further analysis modifies the positions of the interior control points in segments 2 and 5, and the end point of segment 2. The result of the further analysis is then a further varied spline defining a further varied boundary shape 403, where the raised portion defined by segments 3, 4, and 5 has been shifted along the x-axis while maintaining the general profile of the varied boundary shape 402. Again, the further varied boundary shape remains continuous with no overlaps or gaps. This type of analysis and variation can be repeated until an optimum solution is obtained.

Advantageously, the definition of relative terminal point positions by the chord and alfa shape properties facilities the retention of desired features of a given profile under the action of the optimization algorithm.

Figure 5:
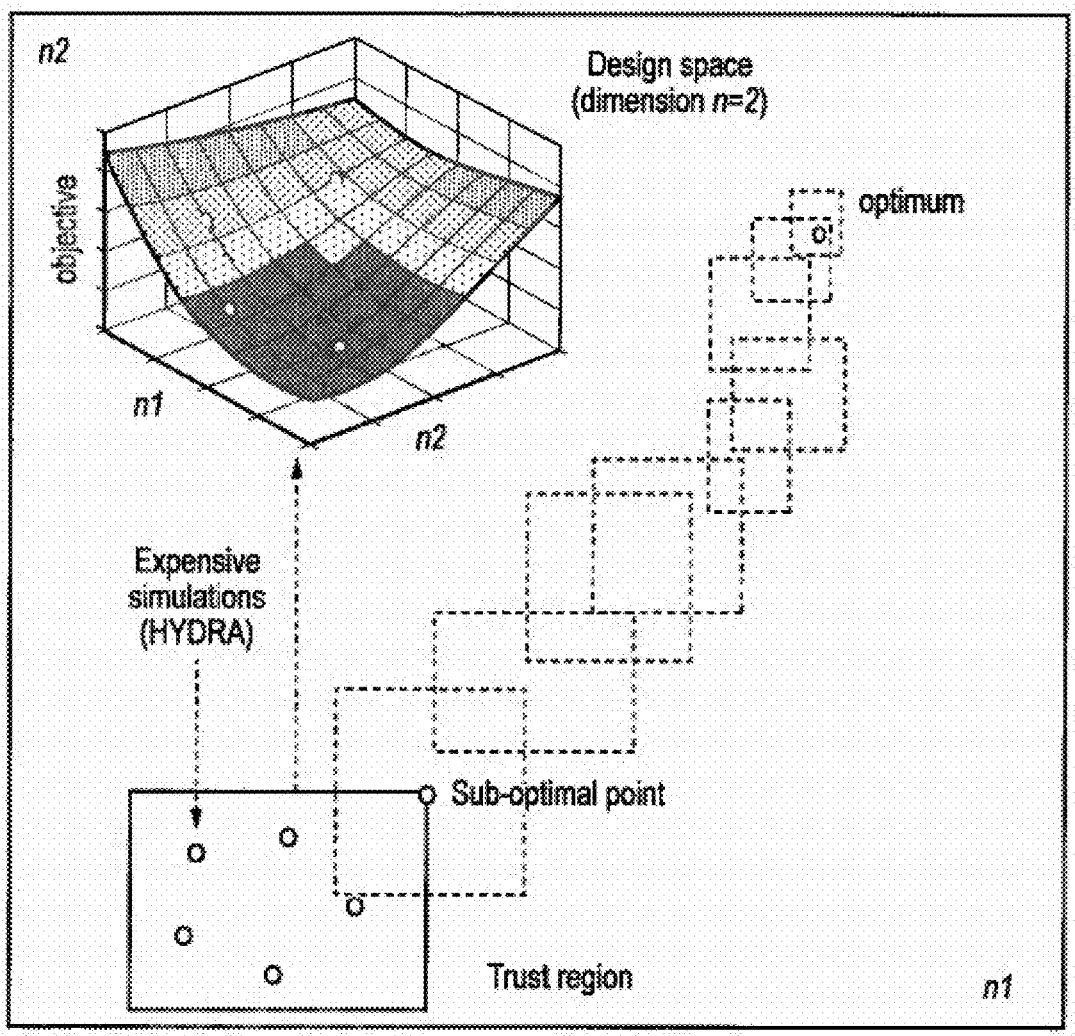
FIG. 5 shows schematically an example of a trust-based design-of-experiment and response surface optimization algorithm.

FIG. 5 shows schematically an example of a trust-based design-of-experiment and response surface optimization algorithm used to adjust an automatically meshable shape having a continuous boundary defined by such a spline. In the example only two parameterised shape properties, n1 and n2, of the spline are varied by the algorithm. An initial "trust region" of n1-n2 space is defined and a limited number (five in the example) of CFD simulations performed on different combinations of values of n1 and n2 to sample the trust region. The results of the simulations allow an objective function response surface to be defined, and the optimal location and value of this function to be estimated for the trust region, and as a result a new region of n1-n2 space can be defined which is likely to include a more optimal value of the objective function. The process can then be repeated until best values for n1 and n2 are arrived at.

Other optimization algorithms, such as genetic algorithms, can also be used to achieve similar results.

The spline of the initial boundary shape 401 may define a cross-section of a combustor cowling of a gas-turbine engine. Computational fluid dynamics simulation can be used to analysis the flow of fluid through the volume defined by the spline to determine a pressure loss as fluid flows through the volume. As a result of the analysis, the optimization algorithm can vary the initial spline so as to reduce the pressure loss in this section of the gas-turbine engine.

Figure 6:
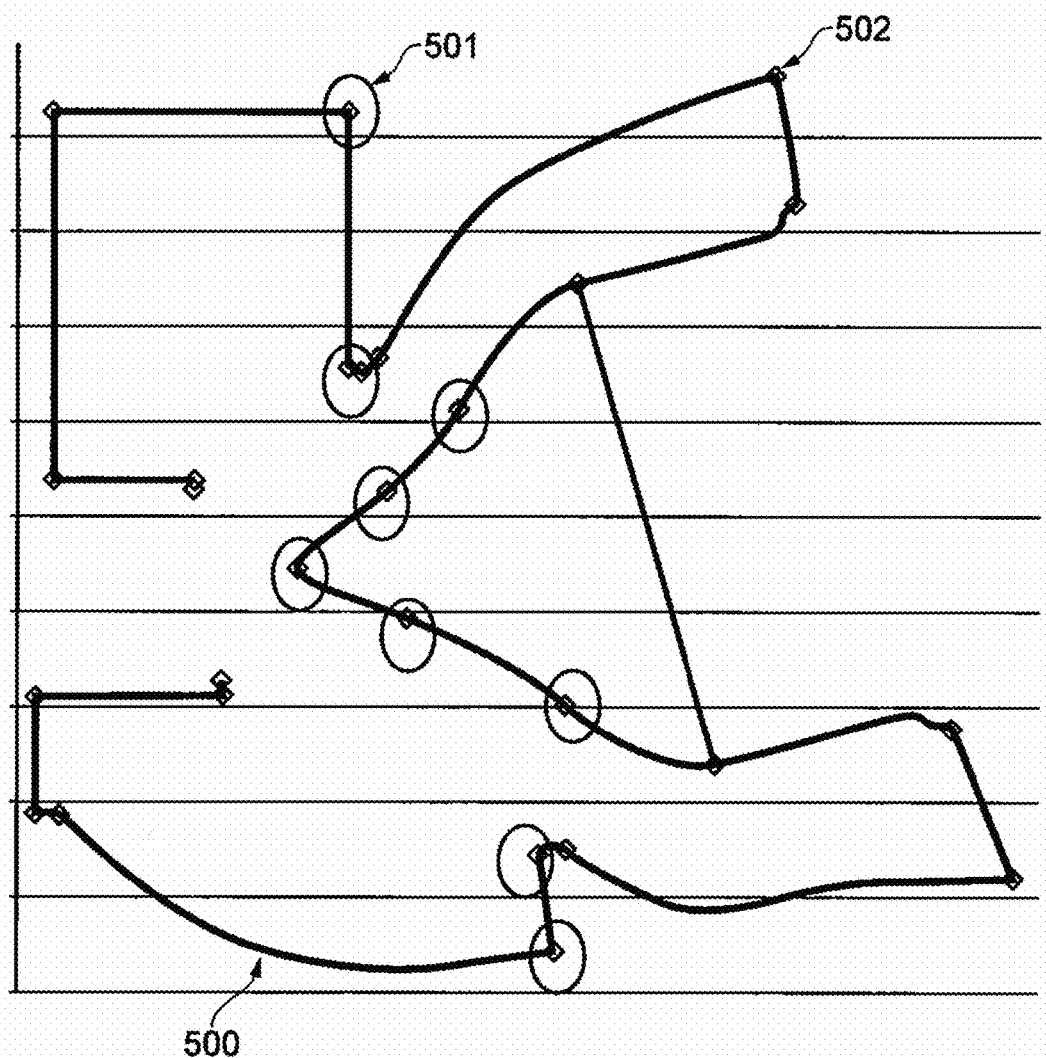
FIG. 6 shows a second spline representing an initial proposal for a dump and cowl region of a gas-turbine engine combustor.
Figure 7:
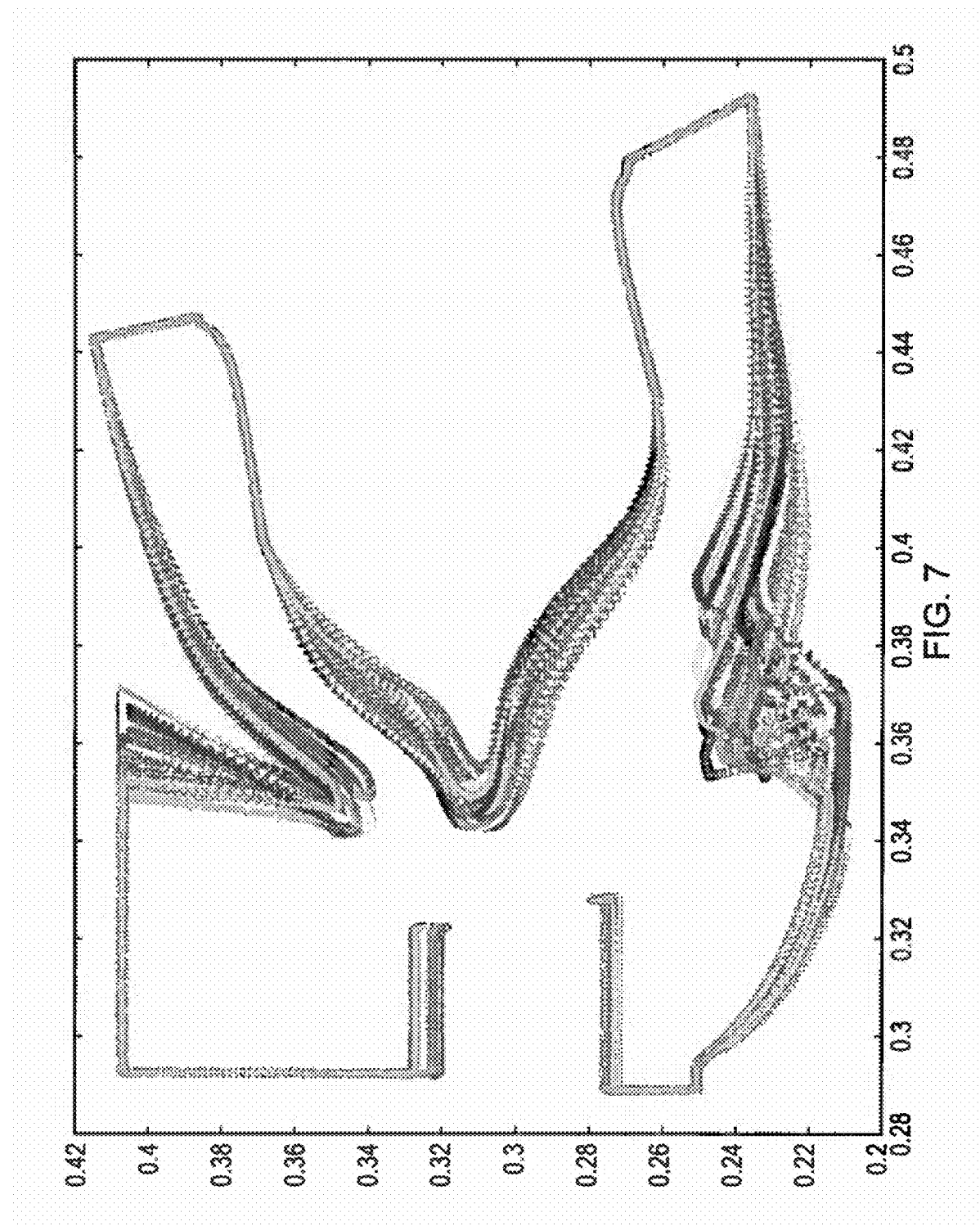
FIG. 7 shows the evolution of the second spline under the action of an optimizer.

FIG. 6 demonstrates a spline 500 representing an initial proposal for a dump and cowl region of a gas-turbine engine combustor. The circled points 501 indicate spline segment terminal points whose positions are variable by an optimization algorithm. The remaining points 502 are segment terminal points whose positions in this case are not modified by the optimization algorithm. The entire spline continues to define a continuous curve (i.e. a manifold) after the positions of the circled points 501 are varied. FIG. 7 shows the evolution of the dump and cowl region defined by the spline 500 under the action of the optimization algorithm. As can be seen, the shapes of the dump and cowl region are gradually varied as a result of the optimization.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

Spline Approach

NURBS (non-rational uniform B-Spline) curves are piecewise defined rational polynomials. They provide a unified mathematical basis for the representation of both analytic shapes, such as conic sections, as well as complex engineering shapes. A NURBS curve, of degree p on the interval [0, 1] is defined by:

$$C(u) = \frac{\sum_{i=0}^{n} W_i N_{i,p}(u) P_i}{\sum_{i=0}^{n} W_i N_{i,p}(u)}$$

where $W_i$ is the weight, $P_i$ is the control point, and $N_{i,p}$ is the p:th degree Bspline basis function and can be computed recursively on the knot vector u as following $$N_{i,p} = \frac{u - u_i}{u_{i+p} - u_i} N_{i,p-1}(u) + \frac{u_{i+p+1} - u}{u_{i+p+1} - u_{i+1}} N_{i+1,p-1}(u).$$

$$N_{i,0}(u) = \begin{cases} 1, & u_i \le u \le u_{i+1} \\ 0, & \text{otherwise} \end{cases}.$$

The approach can easily be extended to 3D surfaces using a double summation, $$S(u, v) = \frac{\sum_{i=0}^{n} \sum_{j=0}^{m} W_{i,j} N_{j,q}(v) N_{i,p}(u) P_{i,j}}{\sum_{i=0}^{n} \sum_{j=0}^{m} W_{i,j} N_{i,p}(u) N_{j,q}(v)}$$

The NURBS curve and surfaces are controlled by the vertices of a defining polygon or poles, which are not necessarily on the curve. Subtle changes in NURBS weights can be used to control the curvature of the geometry.

The invention claimed is:

1. A computer-implemented method of automatically defining an optimized altered spline shape of a component, the method comprising the steps of:
  automatically defining the optimized altered spline shape by performing an optimization algorithm, the optimization algorithm:
    (i) determining interior control points of a spline shape that are variable, the spline shape defining a continuous curve which passes through a number of points;
    (ii) modifying shape properties of the spline segments to produce a new spline shape while maintaining the continuous curve and while creating no overlaps or gaps due to linking together of end points and start points of adjacent spline segments of the new spline shape;
    (iii) performing a computational fluid dynamics (CFD) simulation of the new spline shape to analyze flow of fluid through a volume defined by the new spline shape to determine a pressure loss as fluid flows through the volume;
    (iv) repeating, a limited number of times, steps (i)-(iii) with each new spline shape as the spline shape that is modified and analyzed so as to arrive at a plurality of new spline shapes that have been modified and used in the CFD simulation; and
    (v) automatically defining the optimized altered spline shape, from among the plurality of new spline shapes, so as to reduce pressure loss based on the results of the CFD simulations.

2. The computer-implemented method of claim 1, wherein the modifying step (ii) includes: defining a gradient at a terminal point of at least one of the spline segments to be equal to a gradient at a coincident terminal point of an immediately adjacent spline segment under operation of the optimization algorithm.

3. The computer-implemented method claim 1, wherein the number of spline segments forming the spline shape is defined as an integer N, and the method further includes the step of: varying N under operation of the optimization algorithm.

4. The computer-implemented method of claim 1, wherein the shape properties of each segment comprise any one or more of: a coordinate position of a terminal point of the spline segment; a gradient of the spline segment at a terminal point of the spline segment; a distance between the terminal points of the spline segment; and an angle between a reference line and a line connecting the terminal points of the spline segment.

5. The computer-implemented method of claim 1, wherein the spline shape is a cubic BSpline shape.

6. The computer-implemented method of claim 1, wherein the optimization algorithm is a genetic algorithm or a design-of-experiment algorithm.

7. The computer-implemented method of claim 1, wherein the spline shape is the shape of a gas turbine engine component.

8. The computer-implemented method of claim 7, wherein the component is combustion equipment of the gas turbine engine.

9. The computer-implemented method of claim 1, wherein
  the component is a gas turbine engine component, and
  the method further comprises: automatically defining the optimized altered spline shape, from among the plurality of new spline shapes, so as to reduce pressure loss in a section of a gas-turbine engine based on the results of the CFD simulations.

10. A computer comprising:
  a processor programmed to: automatically define an optimized altered spline shape by performing an optimization algorithm, the optimization algorithm:
    (i) determining interior control points of a spline shape that are variable, the spline shape defining a continuous curve which passes through a number of points;
    (ii) modifying shape properties of the spline segments to produce a new spline shape while maintaining the continuous curve and while creating no overlaps or gaps due to linking together of end points and start points of adjacent spline segments of the new spline shape;
    (iii) performing a computational fluid dynamics (CFD) simulation of the new spline shape to analyze flow of fluid through a volume defined by the new spline shape to determine a pressure loss as fluid flows through the volume;
    (iv) repeating, a limited number of times, steps (i)-(iii) with each new spline shape as the spline shape that is modified and analyzed so as to arrive at a plurality of new spline shapes that have been modified and used in the CFD simulation; and
    (v) automatically defining the optimized altered spline shape, from among the plurality of new spline shapes, so as to reduce pressure loss based on the results of the CFD simulations.

11. A non-transitory computer readable medium comprising a computer program code which, when executed by a computer, causes the computer to perform a method of automatically defining an optimized altered spline shape, the method comprising the steps of:
  automatically defining the optimized altered spline shape by performing an optimization algorithm, the optimization algorithm:
    (i) determining interior control points of a spline shape that are variable, the spline shape defining a continuous curve which passes through a number of points;
    (ii) modifying shape properties of the spline segments to produce a new spline shape while maintaining the continuous curve and while creating no overlaps or gaps due to linking together of end points and start points of adjacent spline segments of the new spline shape; and
    (iii) performing a computational fluid dynamics (CFD) simulation of the new spline shape to analyze flow of fluid through a volume defined by the new spline shape to determine a pressure loss as fluid flows through the volume;
    (iv) repeating a limited number of times steps (i)-(iii) with each new spline shape as the spline shape that is modified and analyzed so as to arrive at a plurality of new spline shapes that have been modified and used in the CFD simulation; and
    (v) automatically defining the optimized altered spline shape, from among the plurality of new spline shapes, so as to reduce pressure loss based on the results of the CFD simulations.

* * * * *